(12) United States Patent
Choi et al.

(10) Patent No.: US 12,707,913 B2
(45) Date of Patent: Aug. 11, 2026

(54) APPARATUS AND METHOD FOR PROCESSING SUBSTRATE USING SUPERCRITICAL FLUID

(71) Applicant: SEMES CO., LTD., Cheonan-si (KR)

(72) Inventors: Hae Won Choi, Daejeon (KR); Thomas Jongwan Kwon, Gyeonggi-do (KR); Chengyeh Hsu, Busan (KR)

(73) Assignee: SEMES Co., Ltd., Cheonan-si (KR)

( * ) Notice: Subject to any disclaimer, the term of this patent is extended or adjusted under 35 U.S.C. 154(b) by 42 days.

(21) Appl. No.: 18/497,425

(22) Filed: Oct. 30, 2023

(65) Prior Publication Data

US 2024/0186135 A1 Jun. 6, 2024

(30) Foreign Application Priority Data

Dec. 6, 2022 (KR) ........................ 10-2022-0168326

(51) Int. Cl.
*H10P 70/00* (2026.01)
*H10P 72/00* (2026.01)

(52) U.S. Cl.
CPC .......... *H10P 70/80* (2026.01); *H10P 72/0406* (2026.01)

(58) Field of Classification Search
None
See application file for complete search history.

(56) References Cited

U.S. PATENT DOCUMENTS 6,848,458 B1 2/2005 Shrinivasan et al.
11,621,159 B2 4/2023 Kim et al.
(Continued)

FOREIGN PATENT DOCUMENTS

JP 2007-027696 A 2/2007
JP 2007-270231 A 10/2007
(Continued)

OTHER PUBLICATIONS

English translation KR 20210078595, accessed on Sep. 2025. (Year: 2021).*
(Continued)

*Primary Examiner* — Kaj K Olsen
*Assistant Examiner* — Arlyn I Rivera-Cordero
(74) *Attorney, Agent, or Firm* — Harness, Dickey & Pierce, P.L.C.

(57) ABSTRACT

A substrate processing method using a supercritical fluid is provided that can deposit a conformal film in a trench with a high aspect ratio and allows complete filling without voids. The substrate processing method comprises performing a supercritical process by repeating a first step, a first vent step, a second step, and a second vent step a plurality of times in order, supplying, in the first step, a first process fluid containing a precursor and a first supercritical fluid to a reactor so that a pressure of the reactor repeats rise and fall within a first pressure range a plurality of times, venting, in the first vent step, the reactor to lower the pressure of the reactor below the first pressure range, supplying, in the second step, a second process fluid containing a reducing fluid to the reactor so that the pressure of the reactor repeats rise and fall within a second pressure range different from the first pressure range a plurality of times, venting, in the second vent step, the reactor to lower the pressure of the reactor below the second pressure range.

14 Claims, 11 Drawing Sheets

(56) References Cited

U.S. PATENT DOCUMENTS

| | | | | |
|---|---|---|---|---|
| 2006/0093746 | A1* | 5/2006 | Strang | C23C 18/1685 427/430.1 |
| 2006/0254615 | A1* | 11/2006 | Kevwitch | H01L 21/02071 134/2 |
| 2007/0012337 | A1 | 1/2007 | Hillman et al. | |
| 2021/0020430 | A1 | 1/2021 | Kim et al. | |
| 2022/0367213 | A1 | 11/2022 | Park et al. | |
| 2023/0064120 | A1 | 3/2023 | Hatanpääet al. | |
| 2024/0183037 | A1* | 6/2024 | Choi | C23C 18/18 |
| 2024/0186135 | A1 | 6/2024 | Choi et al. | |

FOREIGN PATENT DOCUMENTS

| | | | |
|---|---|---|---|
| KR | 10-2010-0122234 | A | 11/2010 |
| KR | 20160026302 | A | 3/2016 |
| KR | 20180037588 | A | 4/2018 |
| KR | 10-2021-0008973 | A | 1/2021 |
| KR | 10-2021-0078595 | A | 6/2021 |
| KR | 102300931 | B1 | 9/2021 |
| KR | 10-2022-0156137 | A | 11/2022 |

OTHER PUBLICATIONS

Korean Office Action dated Nov. 4, 2024 issued in corresponding Korean Patent Appln. No. 10-2022-0168326.

Final Office Action issued Sep. 11, 2025 in U.S. Appl. No. 18/494,979, 23 pages, filed Mar. 12, 2026.

Office Action issued Mar. 24, 2025 in U.S. Appl. No. 18/494,979, 20 pages, filed Mar. 12, 2026.

Non-Final Office Action issued Nov. 25, 2025 in U.S. Appl. No. 18/494,979, 24 pages, filed Mar. 12, 2026.

Final Office Action issued May 29, 2026 in U.S. Appl. No. 18/494,979, 21 pages.

* cited by examiner

FIG. 2

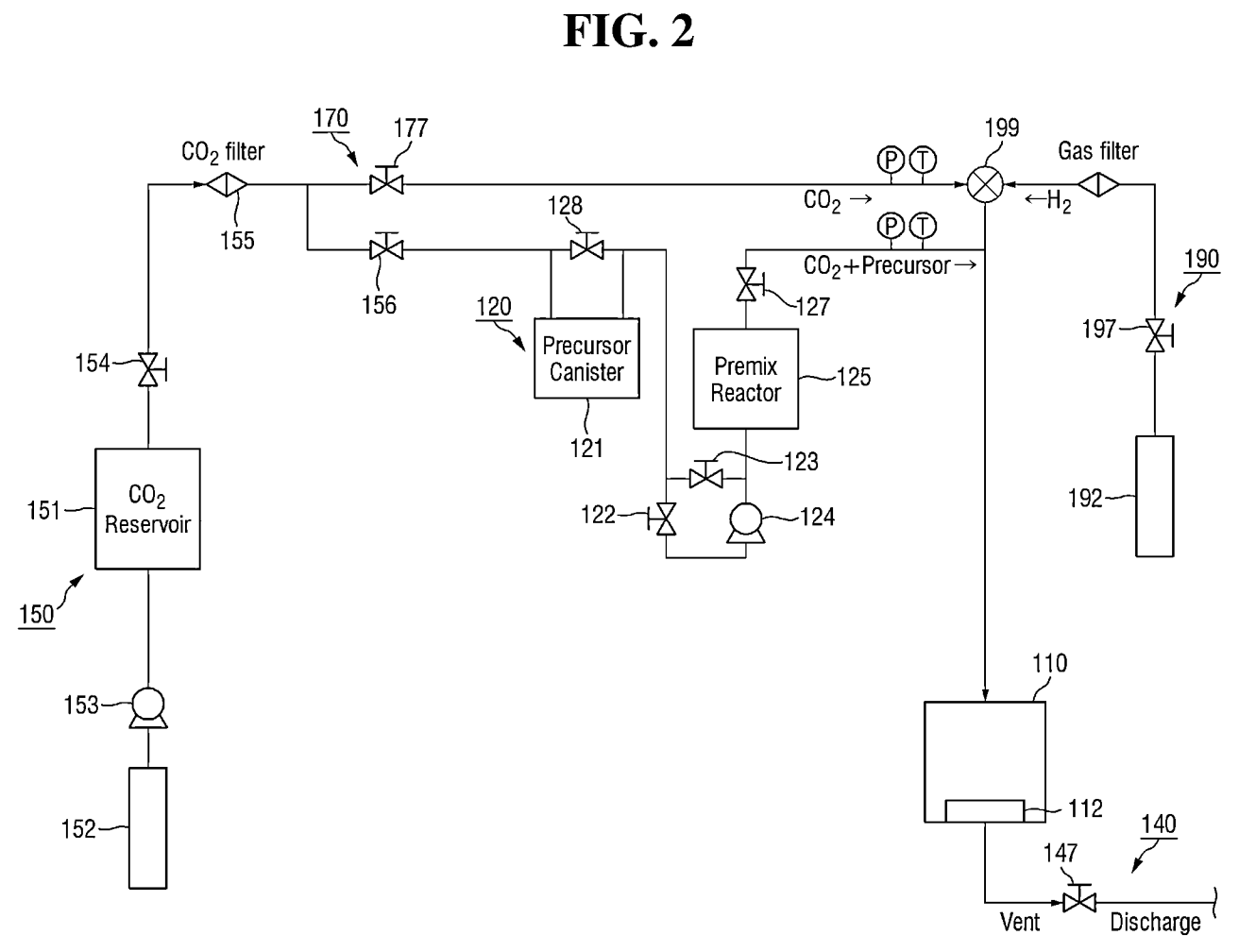

$CO_2$ Reservoir
$CO_2$ filter
Gas filter
$\leftarrow H_2$
$CO_2 \rightarrow$
$CO_2$+Precursor $\rightarrow$
Precursor Canister
Premix Reactor
Vent
Discharge
P
T
110
112
120
121
122
123
124
125
127
128
140
147
150
151
152
153
154
155
156
170
177
190
192
197
199

FIG. 4

HM
111
115
W
105
(S341)
SCC
(S342)
(S343)
364
(S344)
365
(S345)
366
(S346)

FIG. 8

AGING (S51)

$CO_2$+Precursor (S52)

Vent (S53)

$H_2$ (S54)

Vent (S55)

APPARATUS AND METHOD FOR PROCESSING SUBSTRATE USING SUPERCRITICAL FLUID

This application claims the benefit of Korean Patent Application No. 10-2022-0168326, filed on Dec. 6, 2022, in the Korean Intellectual Property Office, the disclosure of which is incorporated herein by reference in its entirety.

BACKGROUND

1. Field

The present invention relates to a substrate processing apparatus and method using a supercritical fluid.

2. Description of the Related Art

As semiconductor devices become more highly integrated, individual circuit patterns are becoming more refined in order to implement more semiconductor devices in the same area. In other words, as the degree of integration of semiconductor devices increases, design rules for the components of semiconductor devices are decreasing.

In highly scaled semiconductor devices, the trench filling process is becoming increasingly difficult. When filling metal through ALD (Atomic Layer Deposition) or CVD (Chemical Vapor Deposition), trenches with high aspect ratios are not sufficiently filled and voids (seams or voids) or pinch-off defects can occur inside the trench.

SUMMARY

The problem to be solved by the present invention aims is to provide a substrate processing method using a supercritical fluid, which can deposit a conformal film in a trench with a high aspect ratio and allows void-free complete gap-filling.

Another problem to be solved by the present invention is to provide a substrate processing apparatus for performing the above method.

The objects of the present invention are not limited to the objects mentioned above, and other objects not mentioned will be clearly understood by those skilled in the art from the description below.

One aspect of the substrate processing method of the present invention to achieve the above problem comprises performing a supercritical process by repeating a first step, a first vent step, a second step, and a second vent step in order a plurality of times, supplying, in the first step, a first process fluid containing a precursor and a first supercritical fluid to a reactor so that a pressure of the reactor repeats rise and fall within a first pressure range a plurality of times, venting, in the first vent step, the reactor to lower the pressure of the reactor below the first pressure range, supplying, in the second step, a second process fluid containing a reducing fluid to the reactor so that the pressure of the reactor repeats rise and fall within a second pressure range different from the first pressure range a plurality of times, venting, in the second vent step, the reactor to lower the pressure of the reactor below the second pressure range.

Another aspect of the substrate processing method of the present invention comprises supplying an aging fluid containing carbon dioxide to a reactor to raise the pressure of the reactor to a first aging pressure higher than a critical pressure, subsequently, venting the reactor to lower the pressure of the reactor to a second aging pressure higher than the critical pressure, subsequently, supplying a first process fluid containing a metal precursor and carbon dioxide to the reactor so that the pressure of the reactor repeats rise and fall within a first pressure range higher than a critical pressure a plurality of times, subsequently, venting the reactor to lower the pressure of the reactor below the first pressure range, subsequently, supplying a second process fluid containing hydrogen to the reactor so that the pressure of the reactor repeats rise and fall within a second pressure range lower than the critical pressure a plurality of times, subsequently, a venting the reactor to lower the pressure of the reactor below a second pressure range.

One aspect of the apparatus for processing a substrate of the present invention to achieve the above problem comprises a reactor, a first process fluid supply unit, a second process fluid supply unit, and a vent unit, wherein the first process fluid supply unit supplies a first process fluid containing a precursor and a first supercritical fluid to the reactor so that a pressure of the reactor repeats rise and fall within a first pressure range a plurality of times, subsequently, the vent unit vents the reactor to lower the pressure of the reactor below the first pressure range, subsequently, the second process fluid supply unit supplies a second process fluid containing a reducing fluid to the reactor so that the pressure of the reactor repeats rise and fall within a second pressure range different from the first pressure range a plurality of times, subsequently, the vent unit vents the reactor to lower the pressure of the reactor below a second pressure range.

Specific details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 2 is an implementation example of the substrate processing apparatus of FIG. 1;

FIG. 4 is a diagram illustrating a change in pressure of a reactor over time to explain a substrate processing method according to some embodiments of the present invention;

FIG. 8 is a diagram for explaining a substrate processing method according to some embodiments of the present invention;

DETAILED DESCRIPTION

Figure 1:
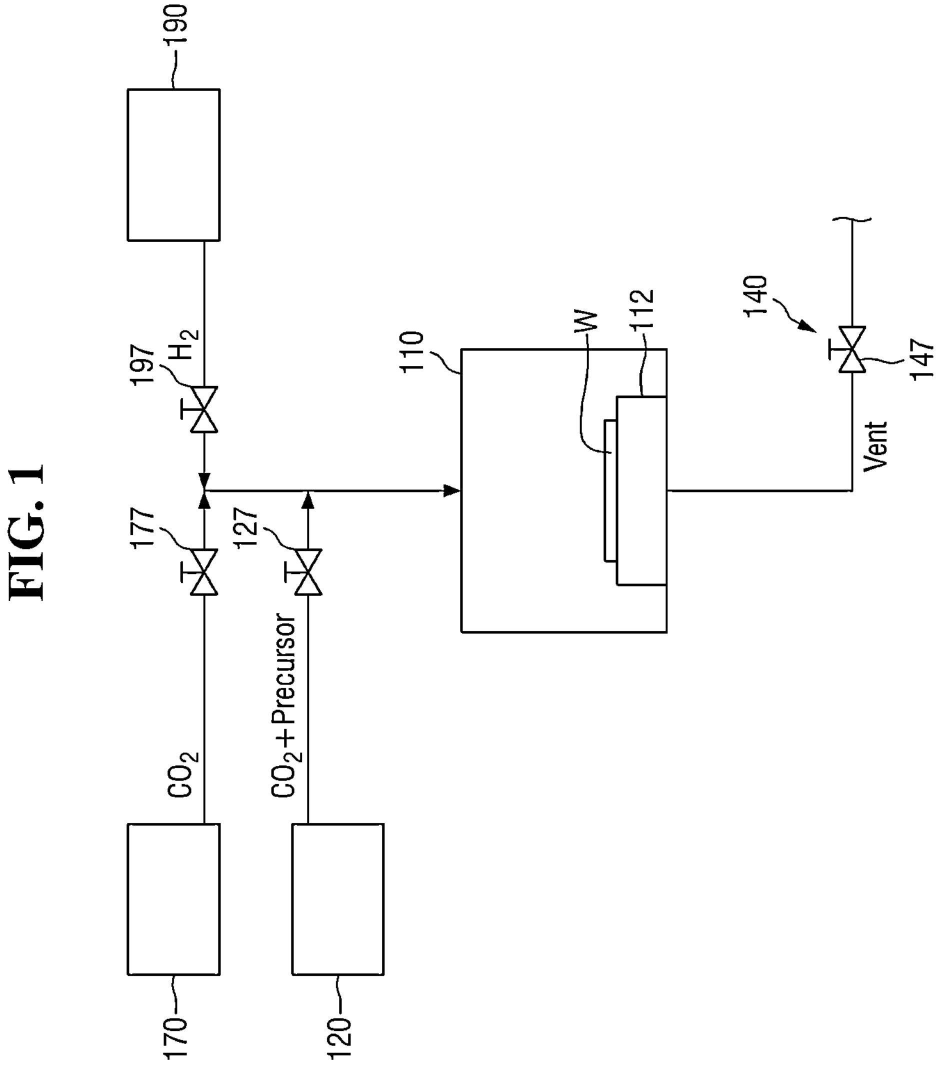
FIG. 1 is a diagram for explaining a substrate processing apparatus according to some embodiments of the present invention.

Hereinafter, preferred embodiments of the present invention will be described in detail with reference to the attached drawings. The advantages and features of the present invention and methods for achieving them will become clear by referring to the embodiments described in detail below along with the accompanying drawings. However, the present invention is not limited to the embodiments disclosed below and may be implemented in various different forms. The present embodiments are merely intended to ensure that the disclosure of the present invention is complete and to full inform those skilled in the technical field to which the present invention pertains on the scope of the invention, and the present invention is only defined by the scope of the claims. Like reference numerals refer to like elements throughout the specification.

Spatially relative terms such as “below,” “beneath,” “lower,” “above,” “upper,” etc. can be used to easily describe the correlation between one elements or components and other elements or components. Spatially relative terms should be understood as terms that include different directions of the element during use or operation in addition to the direction shown in the drawings. For example, if an element shown in the drawings is turned over, an element described as “below” or “beneath” another element may be placed “above” the other element. Accordingly, the illustrative term “below” may include both downward and upward directions. Elements can also be oriented in other directions, so spatially relative terms can be interpreted according to orientation.

Although first, second, etc. are used to describe various components, elements and/or sections, it is understood that these components, elements and/or sections are not limited by these terms. These terms are merely used to distinguish one component, element, or section from other components, elements, or sections. Therefore, the first component, first element, or first section mentioned below may also be a second component, second element, or second section within the technical spirit of the present invention.

Hereinafter, embodiments of the present invention will be described in detail with reference to the accompanying drawings. In the description with reference to the accompanying drawings, identical or corresponding components will be assigned the same reference numbers regardless of the reference numerals, and the redundant explanation for this will be omitted.

FIG. 1 is a diagram for explaining a substrate processing apparatus according to some embodiments of the present invention. FIG. 2 is an implementation example of the substrate processing apparatus of FIG. 1.

First, referring to FIG. 1, a substrate processing apparatus according to some embodiments of the present invention comprises a reactor 110, a first process fluid supply unit 120, a second process fluid supply unit 190, an aging fluid supply unit 170 and a vent unit 140. A controller (not shown) controls the operations of the reactor 110, the first process fluid supply unit 120, the second process fluid supply unit 190, the aging fluid supply unit 170, and the vent unit 140.

The reactor 110 is a space where a process for supercritical fluid progresses. A support 112 for supporting the substrate W is located within the reactor 110.

A supercritical fluid is a substance placed at a temperature and pressure above a critical point, and has the diffusivity of a gas and the solubility of a liquid. Carbon dioxide ($CO_2$), water ($H_2O$), methane ($CH_4$), ethane ($C_2H_6$), propane ($C_3H_8$), ethylene ($C_2H_4$), propylene ($C_3H_6$), methanol ($CH_3OH$), ethanol ($C_2H_5OH$), and acetone ($C_3H_6O$), etc. may be used as supercritical fluids, but are not limited thereto. Below, carbon dioxide is explained as an example of a supercritical fluid.

The first process fluid supply unit 120 supplies a first process fluid containing a precursor and a supercritical fluid into the reactor 110. That is, the first process fluid may include a precursor dissolved by the supercritical fluid. The precursor may be a metal precursor, but is not limited thereto. The metal precursor is in the form of MxLy (where M is a metal, L is a ligand, x and y are natural numbers), and the metal (M) may comprise Ru, Mo, Cu, TiN, TaN, Al, Ti, Ta, Ni, Nb, Rh, Pd, Ir, Ag, Au, Zn, V, etc., but is not limited thereto. The ligand (L) may consist of only C and/or H, but is not limited thereto. That is, the ligand (L) may consist of only one of $C_x$, $H_y$, and $C_xH_y$ (where x and y are natural numbers). Depending on whether the valve 127 is turned on or off, the first process fluid can be supplied to the reactor 110 or stopped.

The first process fluid may or may not be maintained in a supercritical state during the process of being supplied to the reactor 110 (that is, in the supply pipe connected to the reactor 110).

The first process fluid supply unit 120 may supply the first process fluid into the reactor 110 so that the pressure of the reactor 110 raises greater than or equal to the critical pressure. That is, the first process fluid may be in a supercritical state inside the reactor 110. As will be described later, depending on the supply from the first process fluid supply unit 120, the pressure of the reactor 110 may repeatedly rise/fall within the first pressure range a plurality of times.

The second process fluid supply unit 190 supplies a second process fluid containing a reducing fluid into the reactor 110. Examples of reducing fluids may comprise oxygen ($O_2$), hydrogen ($H_2$), and ammonia ($NH_3$), but are not limited thereto. Depending on whether the valve 197 is turned on or off, the second process fluid can be supplied to the reactor 110 or stopped. As will be described later, depending on the supply from the second process fluid supply unit 120, the pressure of the reactor 110 may repeatedly rise/fall within the second pressure range a plurality of times.

The aging fluid supply unit 170 supplies the aging fluid to the inside of the reactor 170 before the first process fluid supply unit 120 supplies the first process fluid, thereby creating an environment inside the reactor 110. For example, the aging fluid supply unit 170 may supply aging fluid to the reactor 110 so that the pressure of the reactor 110 becomes higher than the critical pressure. The aging fluid may include a supercritical fluid. Here, carbon dioxide ($CO_2$) is used as an example of the aging fluid, but it is not limited thereto.

The vent unit 140 vents the reactor 110. That is, the vent unit 140 vents the fluid inside the reactor 110 to the outside. When the valve 147 is in the on state, the vent operation proceeds, and when the valve 147 is in the off state, the vent operation is stopped.

Referring to FIG. 2, the first process fluid supply unit 120 and the aging fluid supply unit 170 receive supercritical fluid (e.g., $CO_2$) from the supercritical fluid supply unit 150.

The supercritical fluid supply unit 150 comprises a first cylinder 152, a syringe pump 153, a first reservoir 151, a filter 155, and valves 154 and 156.

The first cylinder 152 stores liquefied carbon dioxide ($LCO_2$). For example, the first cylinder 152 may be controlled to about 40 bar and about 10° C., but is not limited thereto. Liquefied carbon dioxide is delivered to the first reservoir 151 through the syringe pump 153. The first reservoir 151 stores carbon dioxide. Within the first reservoir 151, carbon dioxide may be in a supercritical state. For example, the first reservoir 151 may be controlled to about 180 bar and about 60° C., but is not limited to this. That is, the first reservoir 151 can be controlled greater than or equal to the critical pressure (7.38 Mpa=73.8 bar) and critical temperature (304.1K=30.95° C.) of carbon dioxide.

Through the filter 155 and the valve 156, carbon dioxide in a supercritical state is supplied to the first process fluid supply unit 120. The first process fluid supply unit 120 includes a precursor canister 121, valves 122, 123, 124, 127, and 128, and a premix reactor 125.

Carbon dioxide provided from the supercritical fluid supply unit 150 is supplied to the precursor canister 121. The precursor is extracted by carbon dioxide within the precursor canister 121 and provided to the premix reactor 125. The extracted precursor, along with carbon dioxide, may be delivered to the premix reactor 125 only through the valve 123, or may be delivered to the premix reactor 125 through the valve 122 and the syringe valve 124.

Additionally, carbon dioxide provided from the supercritical fluid supply unit 150 may be directly supplied to the premix reactor 125 through the valve 128, without passing through the precursor canister 121.

Within the premix reactor 125, a first process fluid (i.e., $CO_2$+Precursor) in which the precursor and carbon dioxide are mixed at a preset ratio is generated. By using carbon dioxide supplied without passing through the precursor canister 121, the preset ratio can be achieved. By doing this, the proportion of carbon dioxide in the first process fluid can be increased. Additionally, the premix reactor 125 can be controlled to about 170 bar and about 60° ° C. to 120° C., but is not limited thereto.

Whether or not the first process fluid (i.e., $CO_2$+Precursor) generated in the premix reactor 125 is supplied to the reactor 110 is determined depending on whether the valve 127 is turned on or off.

Meanwhile, carbon dioxide in a supercritical state is provided to the aging fluid supply unit 170 through the filter 155. The aging fluid supply unit 170 may include a valve 177, and may optionally further include a reservoir capable of temporarily storing a supercritical fluid.

The aging fluid supply unit 170 supplies an aging fluid to the reactor 110 to create an environment inside the reactor 110. Whether or not the carbon dioxide in a supercritical state provided through the filter 155 is supplied to the reactor 110 is determined depending on whether the valve 177 is turned on or off.

The second process fluid supply unit 190 includes a second cylinder 192, a valve 197, a filter, etc. The second process fluid includes a reducing fluid, and here, hydrogen ($H_2$) is taken as an example of the reducing fluid. The second cylinder 192 is a space for storing hydrogen, and whether or not hydrogen is supplied to the reactor 110 is determined depending on whether the valve 197 is turned on or off.

Meanwhile, selectively, by the mix unit 199, the reducing fluid (hydrogen) may be supplied to the reactor 110 together with carbon dioxide in a supercritical state (i.e., in a state in which hydrogen is dissolved by carbon dioxide in a supercritical state).

Figure 3:
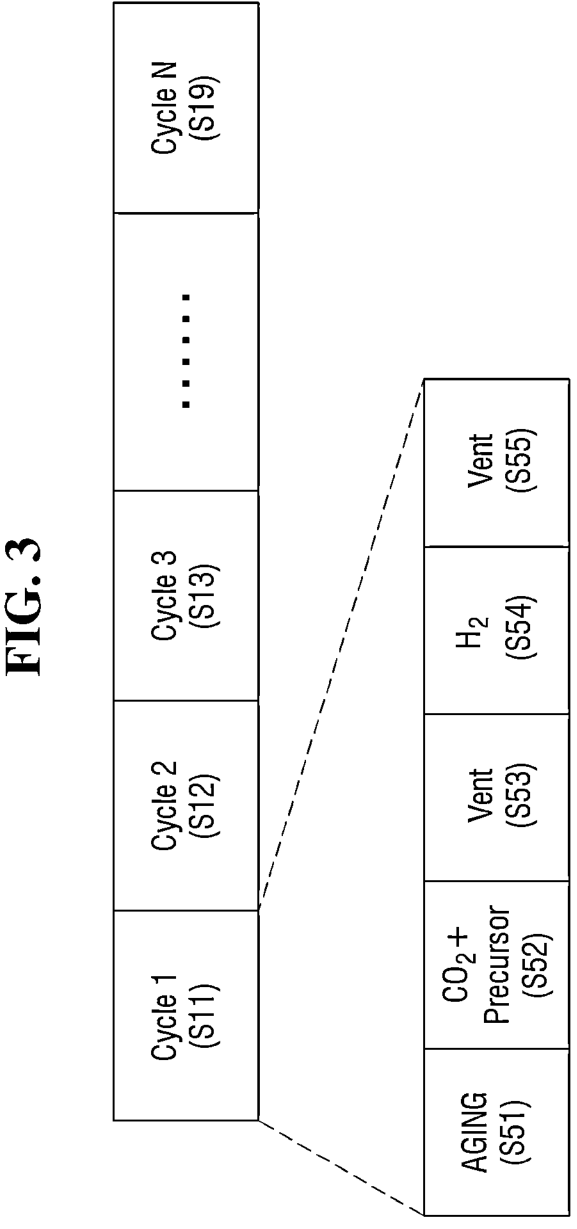
FIG. 3 is a conceptual diagram for explaining a substrate processing method according to some embodiments of the present invention.
Figure 4:
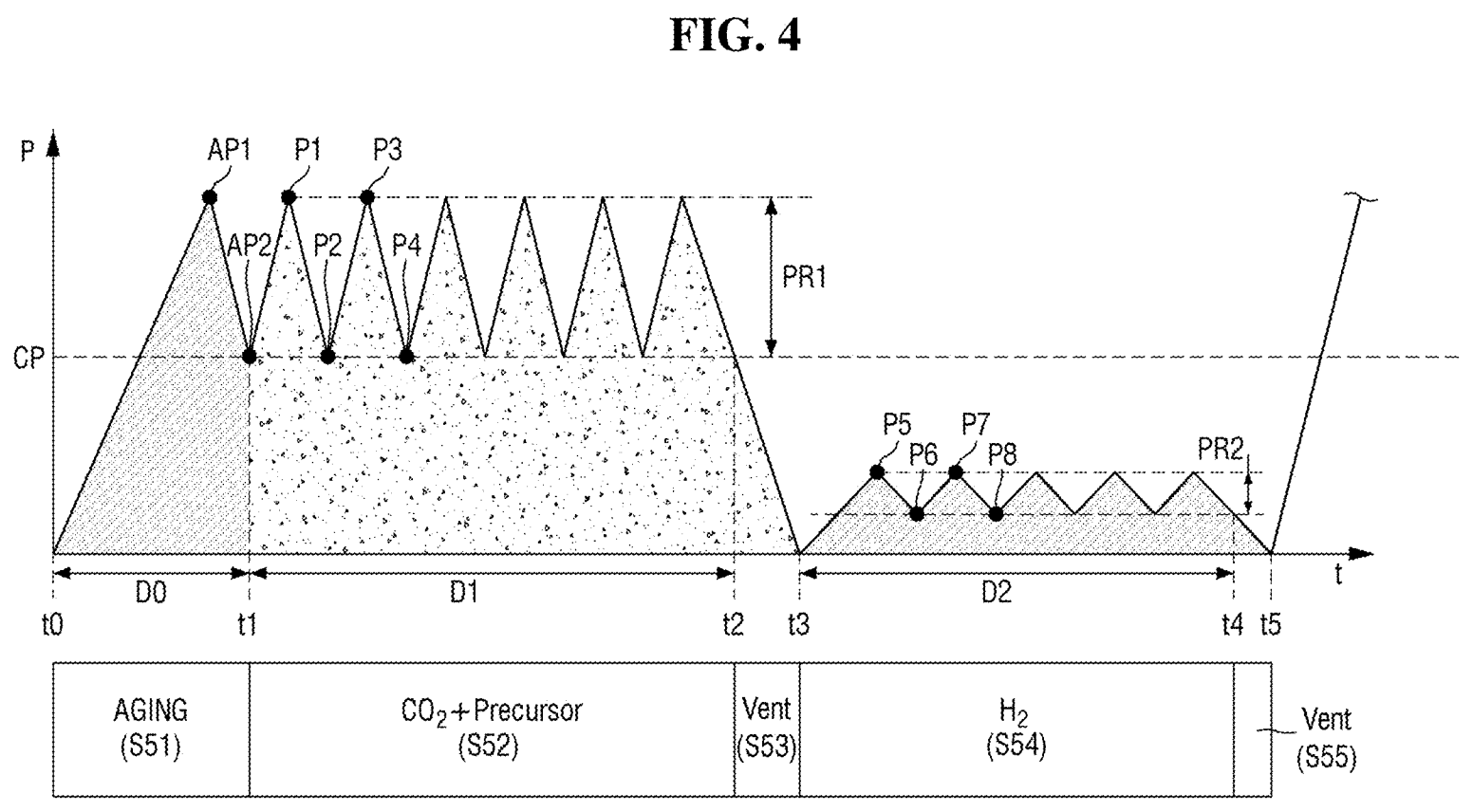
Figure 5:
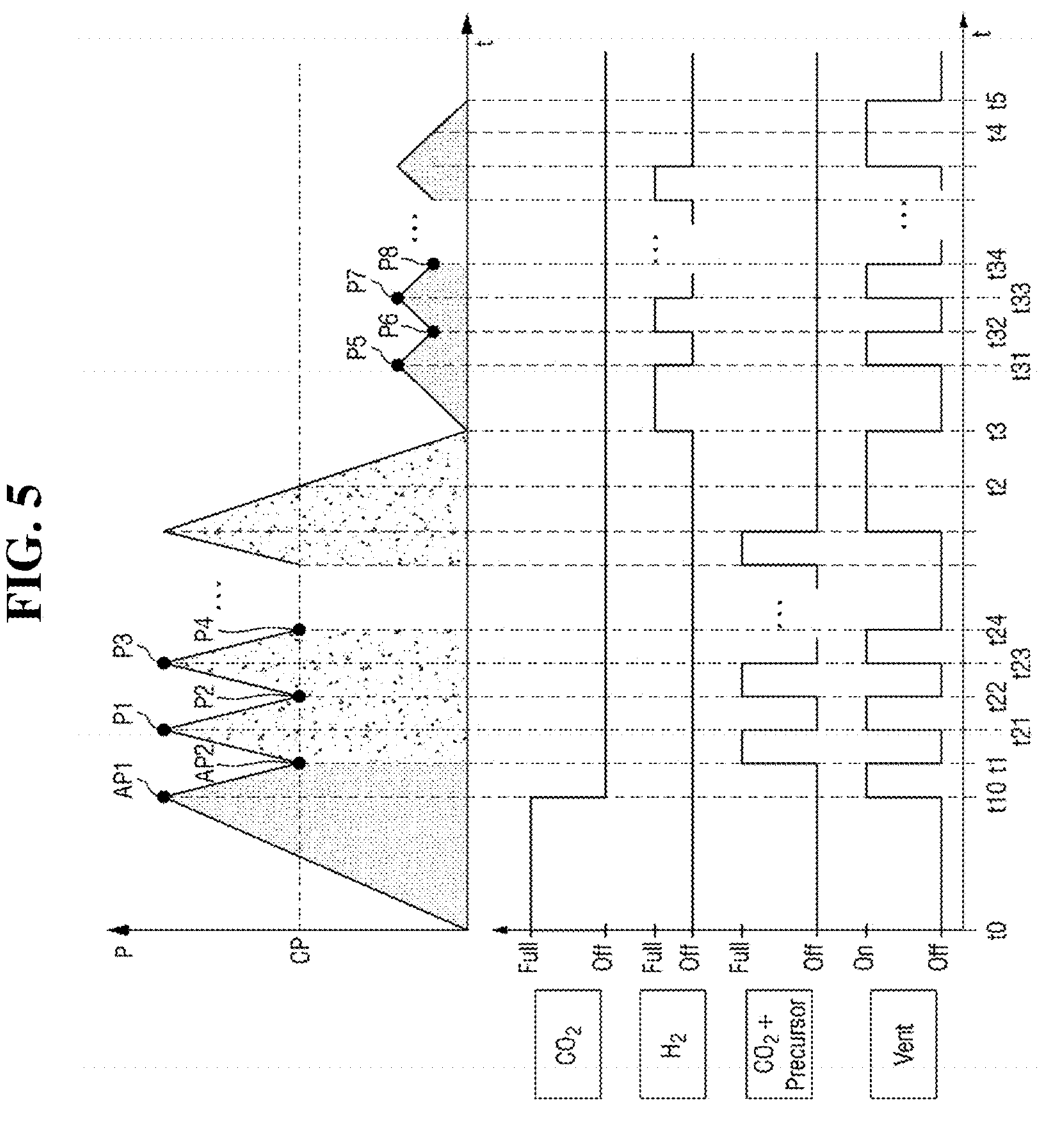
FIG. 5 is a timing diagram of the substrate processing apparatus of FIG. 1 for performing a substrate processing method according to some embodiments of the present invention.

Below, a substrate processing method according to some embodiments of the present invention will be described using FIGS. 3 to 5. FIG. 3 is a conceptual diagram for explaining a substrate processing method according to some embodiments of the present invention. FIG. 4 is a diagram illustrating a change in pressure of a reactor over time to explain a substrate processing method according to some embodiments of the present invention. FIG. 5 is a timing diagram of the substrate processing apparatus of FIG. 1 for performing a substrate processing method according to some embodiments of the present invention.

First, referring to FIG. 3, the substrate processing method according to some embodiments of the present invention includes a plurality of cycles (S11, S12, S13, . . . S19). The number of cycles may vary depending on the thickness of the film (e.g., metal layer) to be deposited. Each cycle (S11, S12, S13, . . . S19) repeats substantially the same steps.

Each cycle (e.g., S11) includes an aging step (S51), a first step (or first process fluid supply step) (S52), a first vent step (S53), a second step (or second process fluid supply step) (S54), and a second vent step (S55).

In the aging step (S51), the aging fluid is supplied to the reactor 110 to create an environment inside the reactor 110.

In the first step (S52), a first process fluid containing a precursor and a supercritical fluid is supplied to the reactor 110 so that the pressure of the reactor 110 repeats rise and fall within the first pressure range a plurality of times.

In the first vent step (S53), the reactor 110 is vented to lower the pressure of the reactor 110 below the first pressure range.

In the second step (S54), the second process fluid containing the reducing fluid is supplied to the reactor 110 so that the pressure of the reactor 110 repeats rise and fall within a second pressure range different from the first pressure section a plurality of times.

In the second vent step (S55), the reactor 110 is vented to lower the pressure of the reactor 110 below the second pressure range.

Each step (S51 to S55) will be explained using FIGS. 4 and 5.

Referring to FIG. 4, in the aging step (S51) (i.e., times t0 to t1), an aging operation is performed to create an environment inside the reactor 110. Specifically, an aging fluid containing a supercritical fluid (e.g., $CO_2$) is supplied to raise the pressure of the reactor 110 to a pressure AP1 greater than or equal to the critical pressure CP. The aging fluid may include only a supercritical fluid (e.g., $CO_2$), or it may include a supercritical fluid and hydrogen ($H_2$). Next, the aging fluid is vented from the reactor 110 to lower the pressure of the reactor 110 to pressure AP2. As shown, the pressure AP2 may also be greater than or equal to the critical pressure CP, but is not limited thereto.

Subsequently, in the first process fluid supply step (S52) (i.e., time t1 to t2), the first process fluid including the precursor and the supercritical fluid is supplied to the reactor 110.

In particular, depending on the supply of the first process fluid, the pressure of the reactor 110 may repeatedly rise and fall within the first pressure range PR1 a plurality of times. The first pressure range PR1 may be greater than or equal to the first valley pressure (e.g., P2, P4) or less than or equal to the first peak pressure (e.g., P1, P3). Specifically, the pressure of the reactor 110 is raised to a pressure P1 greater than or equal to the critical pressure CP. Next, the first process fluid is vented from the reactor 110 to lower the pressure of the reactor 110 to pressure P2. Next, the pressure of the reactor 110 is raised again to a pressure P3 greater than or equal to the critical pressure CP. Next, the first process fluid is vented from the reactor 110 to lower the pressure of the reactor 110 back to pressure P4. In this way, the rise and fall are repeated. In the drawing, the rise and fall are shown to be repeated 6 times, but it is not limited to this. The pressure P1 and pressure P3 are shown at the same level, and the pressure P2 and pressure P4 are shown at the same level, but the present invention is not limited thereto. Additionally, the pressures P2 and P4, like the pressures P1 and P3, may be greater than or equal to the critical pressure CP, but are not limited thereto. The pressures P1, P3 may be 85 bar to 170 bar, and the pressures P2, P4 may be 75 bar to 160 bar, but are not limited thereto.

The precursor may be a metal precursor, but is not limited thereto. The metal precursor may be a combination of a metal (M) and a ligand (L). The metal (M) may include, but is not limited to, Ru, Mo, Cu, TiN, TaN, Al, Ti, Ta, Ni, Nb, Rh, Pd, Ir, Ag, Au, Zn, V, etc. The ligand (L) may consist of only C and/or H, but is not limited thereto. That is, the ligand (L) may consist of only one of $C_x$, $H_y$, and $C_xH_y$ (where x and y are natural numbers).

Subsequently, in the first vent step S53 (i.e., times t2 to t3), the reactor 110 is vented to lower the pressure of the reactor 110 below the first pressure range PR1. Lowering the pressure below the first pressure range PR1 means lowering it below the lowest pressure of the first pressure range PR1 (or the first valley pressure (see P2, P4)). For example, the pressure can be lowered to normal pressure or a pressure similar to normal pressure.

Subsequently, in the second process fluid supply step (S54) (i.e., times t3 to t4), the second process fluid containing the reducing fluid is supplied to the reactor 110.

In particular, depending on the supply of the second process fluid, the pressure of the reactor 110 may repeat rise and fall within the second pressure range PR2 a plurality of times. The first pressure range PR2 may be greater than or equal to the second valley pressure (e.g., P6, P8) or less than or equal to the second peak pressure (e.g., P5, P7). Specifically, the pressure of the reactor 110 is raised to pressure P5. Next, the second process fluid is vented from the reactor 110 to lower the pressure of the reactor 110 to pressure P6. Next, the pressure of the reactor 110 is raised again to pressure P7. Next, the second process fluid is vented from the reactor 110 to lower the pressure of the reactor 110 back to pressure P8. In this way, the rise and fall are repeated. In the drawing, it is shown that the rise and fall are repeated 5 times, but it is not limited to this. Although the pressures P5 and P7 are shown at the same level, and the pressures P6 and P8 are shown at the same level, they are not limited thereto. Additionally, the pressures P5, P6, P7, P8 may be less than the critical pressure CP. The pressures P5, P7 may be 85 bar to 170 bar, and the pressures P6, P8 may be 75 bar to 160 bar, but are not limited thereto.

Subsequently, in the second vent step S55 (i.e., times t4 to t5), the reactor 110 is vented to lower the pressure of the reactor 110 below the second pressure range PR2. Lowering the pressure below the second pressure range PR2 means lowering it below the lowest pressure of the second pressure range PR2 (or the second valley pressure (see P6, P8)). For example, the pressure can be lowered to normal pressure or a pressure similar to normal pressure.

The period D1 of the first process fluid supply step S52 may be greater than or equal to the period D2 of the second process fluid supply step S54. Additionally, the period D1 of the first process fluid supply step S52 may be larger than the period D0 of the aging step S51.

Meanwhile, the reason for providing the aging step (S51) before the first process fluid supply step (S52) is as follows. If the first process fluid is started to be supplied into the reactor 110 from the beginning without the aging step (S51), the first process fluid may be concentrated near some areas (for example, the center area) of the substrate W. Therefore, by spreading the aging fluid inside the reactor 110 during the aging step (S51), it is possible to prevent the first process fluid supplied thereafter from being concentrated near some areas of the substrate W. In addition, the aging step serves to adjust the temperature and pressure inside the chamber to the actual process atmosphere conditions before starting to introduce the first process fluid.

In addition, as shown in FIG. 4, in the first process fluid supply step (S52), the supply of the first process fluid is adjusted to repeatedly raise and fall the pressure of the reactor 110, thereby creating a flow of the first process fluid (i.e., flow generation) within the reactor 110. Likewise, by controlling the supply of the second process fluid in the second process fluid supply step (S54), a flow of the second process fluid can be created (i.e., flow generation) within the reactor 110. That is, flow momentum and turbulence are generated through the first process fluid supply step (S52) and the second process fluid supply step (S54), which are alternately performed. By doing this, the first process fluid and the second process fluid can easily penetrate into the space between the high aspect ratio trenches in the substrate W. Accordingly, it is possible to stably generate a conformal film and achieve full gap-filling even in complex structures.

Additionally, in the first vent step (S53), while the first process fluid is withdrawn from the reactor 110, the pressure of the reactor 110 rapidly drops below the critical pressure (CP) to near normal pressure. Accordingly, condensation occurs. That is, the metal precursor of the first process fluid condensates on the surface of the trench. Additionally, in the second vent step (S55), while the second process fluid is withdrawn from the reactor 110, the pressure of the reactor 110 rapidly drops to near normal pressure. Accordingly, the reducing fluid adheres to the surface of the trench, and the reducing fluid and the metal precursor react to precipitate the metal. For example, if the metal precursor of the first process fluid is $ML_2$ (M is metal, L is ligand), and the reducing fluid of the second process fluid contains $H_2$, the ligand is removed by the reducing fluid as shown in the following chemical reaction equation, and metal is precipitated.

$$ML_2+H_2 \rightarrow M+2HL$$

Here, referring to FIGS. 1 and 5, at times t0 to t10, the aging fluid supply unit 170 supplies the aging fluid ($CO_2$) to the reactor 110 so that the pressure of the reactor 110 is equal to or higher than the critical pressure. (see pressure AP1).

At times t10 to t1, the vent unit 140 vents the aging fluid inside the reactor 110 to lower the pressure of the reactor 110 (see pressure AP2).

At times t1 to t21, the first process fluid supply unit 120 supplies the first process fluid ($CO_2$+Precursor) to the reactor 110 so that the pressure of the reactor 110 is equal to or greater than the critical pressure (see pressure P1).

At times t21 to t22, the vent unit 140 vents the fluid inside the reactor 110 to lower the pressure of the reactor 110 (see pressure P2).

At times t22 to t23, the first process fluid supply unit 120 supplies the first process fluid ($CO_2$+Precursor) to the reactor 110 so that the pressure of the reactor 110 is equal to or greater than the critical pressure (see pressure P3).

At times t23 to t24, the vent unit 140 vents the fluid inside the reactor 110 to lower the pressure of the reactor 110 (see pressure P4).

In this way, in the first process fluid supply step (S52), the pressure of the reactor 110 repeats rise/fall within the first pressure range RP1 a plurality of times.

Subsequently, at times t2 to t3, the vent unit 140 continues to vent the fluid inside the reactor 110 to lower the pressure of the reactor 110 to normal pressure or a pressure similar to normal pressure.

At times t3 to t31, the second process fluid supply unit 190 supplies the second process fluid ($H_2$) to the reactor 110 so that the pressure of the reactor 110 is equal to greater than the critical pressure (see pressure P5).

At times t31 to t32, the vent unit 140 vents the fluid inside the reactor 110 to lower the pressure of the reactor 110 (see pressure P6).

At times t32 to t33, the second process fluid supply unit 190 supplies the second process fluid ($H_2$) to the reactor 110 so that the pressure of the reactor 110 is equal to or greater than the critical pressure (see pressure P7).

At times t33 to t34, the vent unit 140 vents the fluid inside the reactor 110 to lower the pressure of the reactor 110 (see pressure P8).

In this way, in the second process fluid supply step (S54), the pressure of the reactor 110 repeats rise/fall within the second pressure range RP2 a plurality of times.

Then, at times t4 to t5, the vent unit 140 continues to vent the fluid inside the reactor 110 to lower the pressure of the reactor 110 to normal pressure or a pressure similar to normal pressure.

Figure 6:
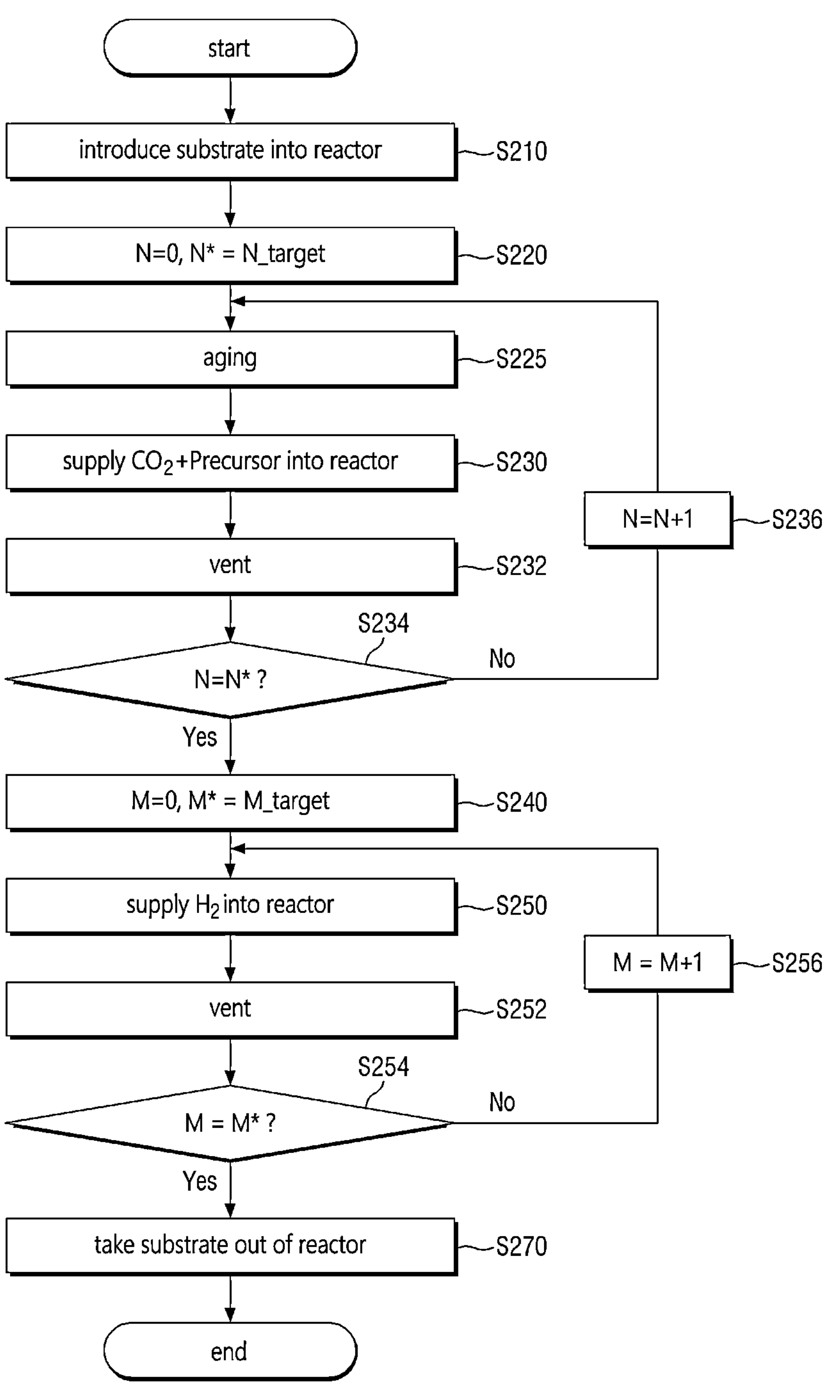
FIG. 6 is a flow chart related to the operation of the substrate processing apparatus of FIG. 1 for performing a substrate processing method according to some embodiments of the present invention.

FIG. 6 is a flow chart related to the operation of the substrate processing apparatus of FIG. 1 for performing a substrate processing method according to some embodiments of the present invention. For convenience of explanation, content that is substantially the same as that described using FIG. 4 will be omitted.

Referring to FIG. 6, first, the substrate W is introduced into the reactor 110 (S210).

Next, N (number of repetitions) is set to 0, and N* is set to the target value (N_target) (or the preset target repetition number) (S220).

Next, an aging operation is performed (S225). As described above, an aging fluid containing a supercritical fluid (e.g., $CO_2$) is supplied to create an environment inside the reactor 110.

Next, the first process fluid ($CO_2$+Precursor) is supplied into the reactor 110 (S230).

Next, the reactor 110 is vented (S232).

Next, it is checked whether N has reached the target value (N*) (S234).

Here, if N does not reach the target value (N*) (i.e., No in S234), the value of N is increased by 1 (N=N+1, S236). Again, the first process fluid supply (S230) and vent (S232) are repeated. In this way, the first process fluid supply (S230) and vent (S232) are repeated until the repetition number (N) reaches the preset number (N*). Accordingly, the pressure of the reactor 110 repeats rise/fall within the first pressure range PR1 a preset number of times (N*).

When N reaches the target value (N*) (i.e., Yes in S234), the fluid inside the reactor 110 is vented to lower the pressure of the reactor 110 to normal pressure.

Next, M (number of repetitions) is set to 0, and M* is set to the target value (M_target) (or the preset target repetition number) (S240).

Next, the second process fluid ($H_2$) is supplied into the reactor 110 (S250).

Next, the reactor 110 is vented (S252).

Next, it is checked whether M has reached the target value (M*) (S254).

Here, if M does not reach the target value (M*) (i.e., No in S254), the value of M is increased by 1 (M=M+1, S256). Again, the second process fluid supply (S250) and vent (S252) are repeated. In this way, the second process fluid supply (S250) and vent (S252) are repeated until the repetition number (M) reaches the preset number (M*). Accordingly, the pressure of the reactor 110 repeats rise/fall within the second pressure range PR2 a preset number of times (M*).

When M reaches the target value (M*) (i.e., Yes in S254), the fluid inside the reactor 110 is vented to lower the pressure of the reactor 110 to normal pressure.

Next, the substrate W is taken out of the reactor 110 (S270).

Figure 7:
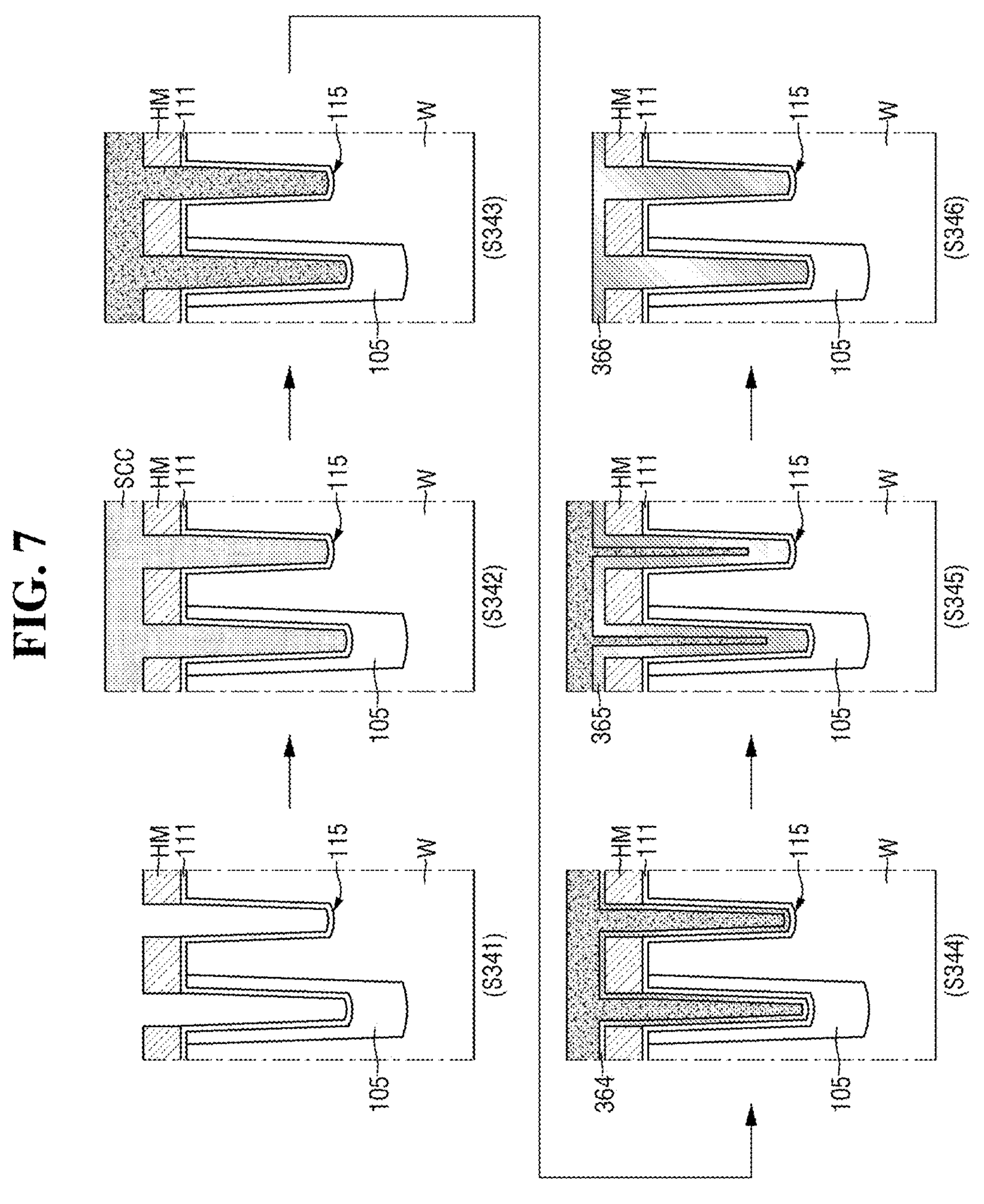
FIG. 7 is a diagram illustrating a process of filling a trench with metal using a substrate processing method according to some embodiments of the present invention.

FIG. 7 is a diagram illustrating a process of filling a trench with metal using a substrate processing method according to some embodiments of the present invention. For example, FIG. 7 explains the process of forming a word line (metal layer) within a word line trench in DRAM.

Referring to FIG. 7, the substrate W on which the trench 115 is formed is placed inside the reactor 110 (S341). Specifically, a device isolation film 105 is formed on the substrate W, and a plurality of trenches 115 are formed. An insulating film 111 is formed conformally along the inner wall of the trench 115. Additionally, a hard mask (HM) is also formed.

Next, inside the reactor 110, a metal precursor (SCC) in a supercritical state penetrates between the trenches 115 (S342). Here, the penetrating metal precursor (SCC) in a supercritical state corresponds to the above-described first process fluid (i.e., $CO_2$+Precursor).

Metal precursors in a supercritical state have high penetrating power, very low surface tension, and high diffusivity compared to liquids. In addition, metal precursors in a supercritical state have high density and high solubility compared to gas. Due to these characteristics, using a metal precursor in a supercritical state allows for faster deposition compared to ALD (atomic layer deposition). Additionally, it has better step-coverage than CVD (Chemical Vapor Deposition) and can minimize defect/contamination risks.

As described above, the supply of the first process fluid is adjusted to raise and lower the pressure of the reactor 110, thereby creating a flow of the first process fluid within the reactor 110. Accordingly, the first process fluid more easily penetrates into the space between the trenches 115.

Next, a reducing fluid is provided inside the reactor 110 (S343). Here, the provided reducing fluid corresponds to the above-described second process fluid ($H_2$).

As described above, the flow of the second process fluid can be created within the reactor 110 by adjusting the supply of the second process fluid to raise and then lower the pressure of the reactor 110. Accordingly, the second process fluid more easily penetrates into the space between the trenches 115.

Next, the metal precursor and the reducing fluid react to begin form thin metal 364 inside the trench 115 (S344).

Subsequently, as described above, as the supply of the metal precursor and the supply of the reducing fluid are repeated a plurality of times, the thickness of the metal 365 begins to increase (S345).

Then, the metal 366 completely fills trench 115. The metal 366 may also be formed on the upper surface of the trench 115 (S346). The metal 366 formed here is called a pre-metal layer.

Although not shown separately, in the drawing, atomic layer etching (ALE) is used to remove a portion of the free metal layer 366 to complete a metal layer (i.e., word line) that fills a portion of the trench 115. A capping film (a capping conductive film and/or a capping insulating film) may be additionally formed on the metal layer in the trench 115.

Figure 8:
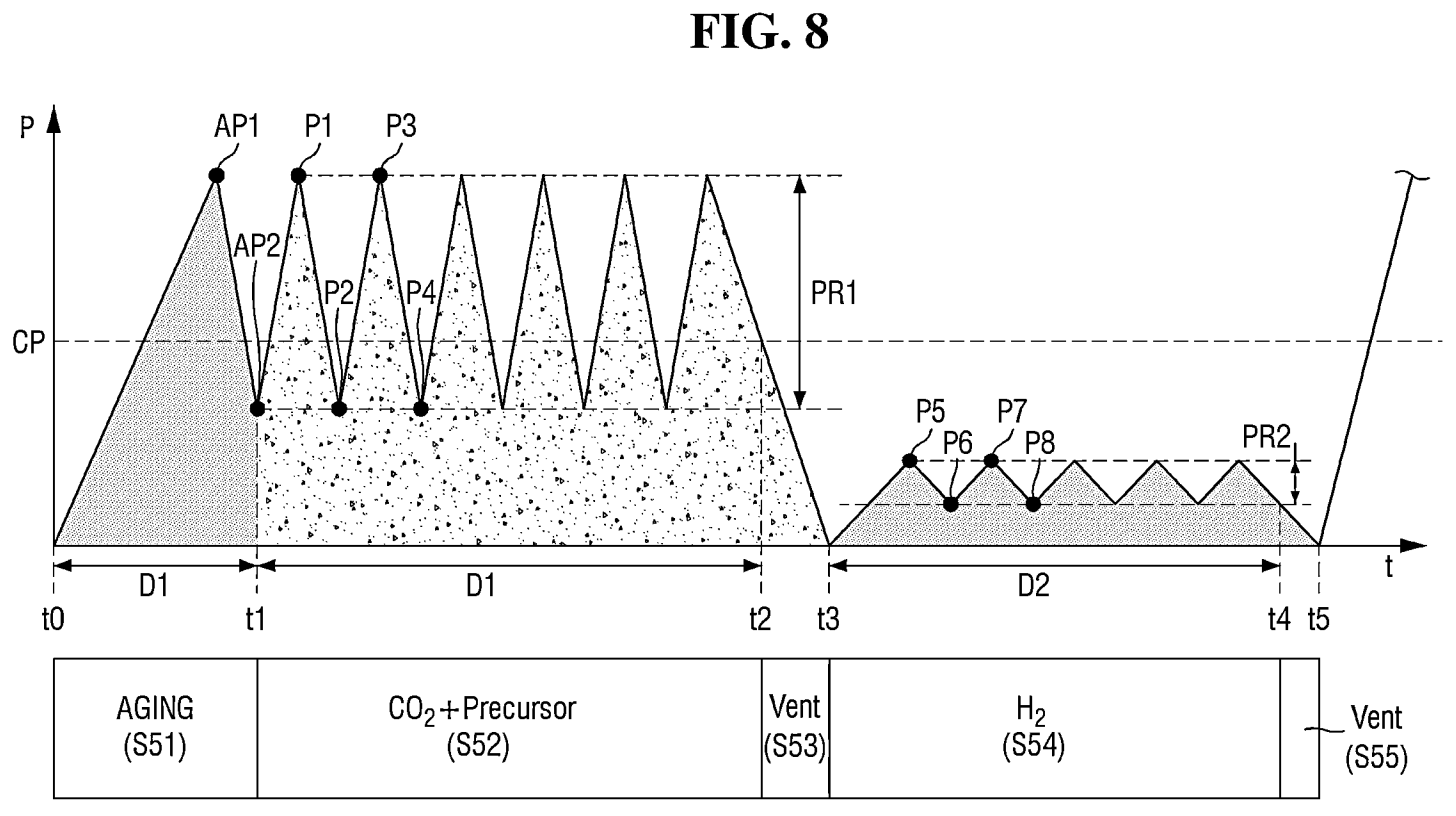

FIG. 8 is a diagram for explaining a substrate processing method according to some embodiments of the present invention. For convenience of explanation, differences from those described using FIG. 4 will be mainly explained.

In the embodiment described using FIG. 4, the lowest pressure AP2 in the aging step (S51) and the first valley pressures P2, P4 in the first process fluid supply step (S52) are equal to or greater than the critical pressure CP.

On the other hand, referring to FIG. 8, the lowest pressure AP2 in the aging step (S51) and the first valley pressures P2, P4 in the first process fluid supply step (S52) are smaller than the critical pressure CP.

Figure 9:
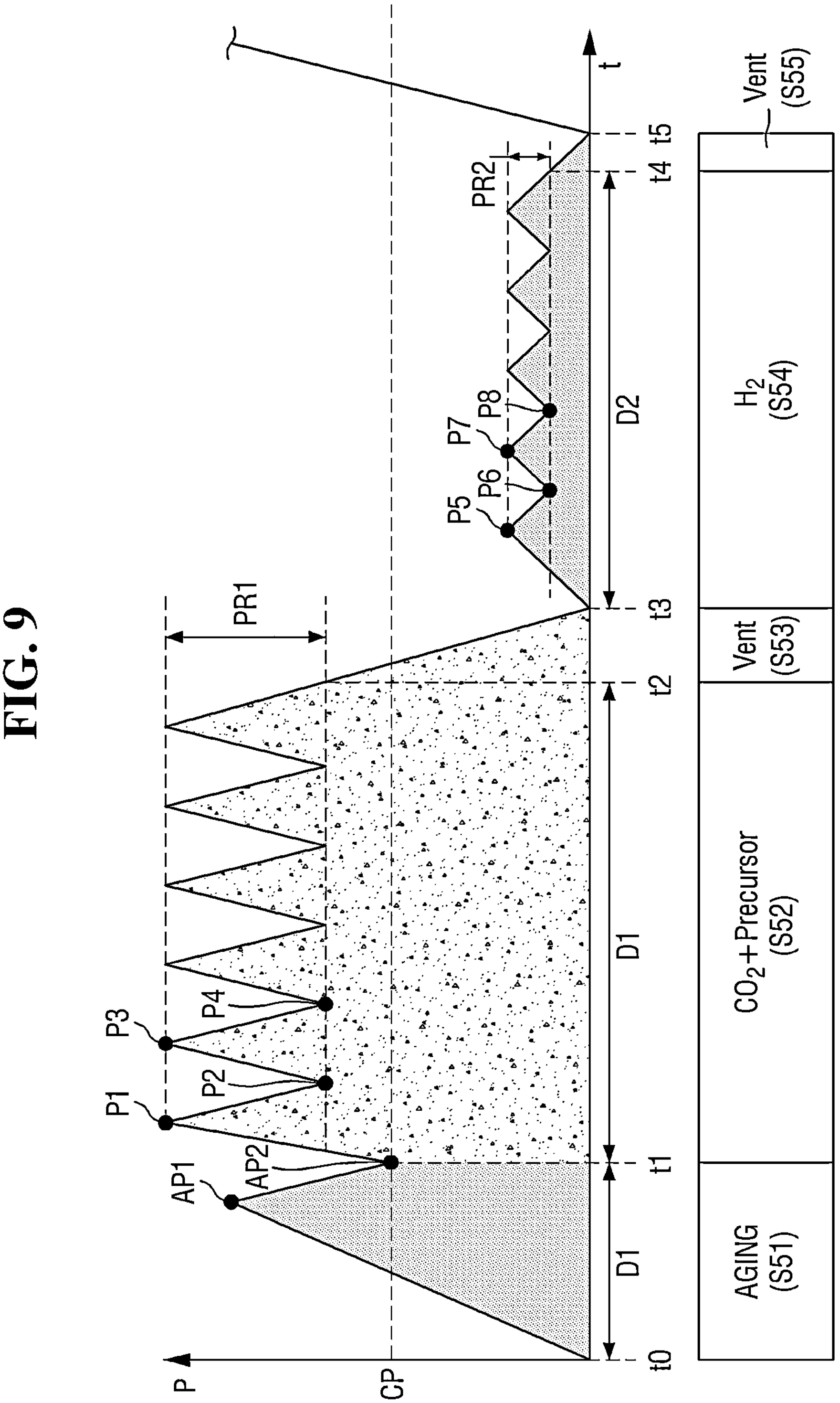
FIG. 9 is a diagram for explaining a substrate processing method according to some embodiments of the present invention.

FIG. 9 is a diagram for explaining a substrate processing method according to some embodiments of the present invention. For convenience of explanation, differences from those described using FIG. 4 will be mainly explained.

In the embodiment described using FIG. 4, the highest pressure AP1 in the aging step (S51) and the first peak pressures P1, P3 in the first process fluid supply step (S52) may be substantially the same.

On the other hand, referring to FIG. 9, the highest pressure AP1 in the aging step (S51) and the first peak pressures P1, P3 in the first process fluid supply step (S52) are different from each other. For example, the first peak pressures P1, P3 in the first process fluid supply step (S52) may be greater than the highest pressure AP1 in the aging step (S51).

Similarly, the pressure AP2 in the aging step (S51) and the first valley pressures P2, P4 in the first process fluid supply step (S52) are different from each other. For example, the first valley pressures P2, P4 in the first process fluid supply step (S52) may be greater than the pressure AP2 in the aging step (S51).

In addition, although not separately shown, the first peak pressures P1, P3 are shown to be constant in the first process fluid supply step (S52), but are not limited thereto. If necessary, a certain first peak pressure (e.g., P1) may be higher than another first peak pressure (e.g., P3).

Likewise, although the first valley pressures P2 and P4 are shown to be constant in the first process fluid supply step (S52), the process is not limited thereto. If necessary, one first valley pressure (P2) may be higher than the other first valley pressure (P4).

Figure 10:
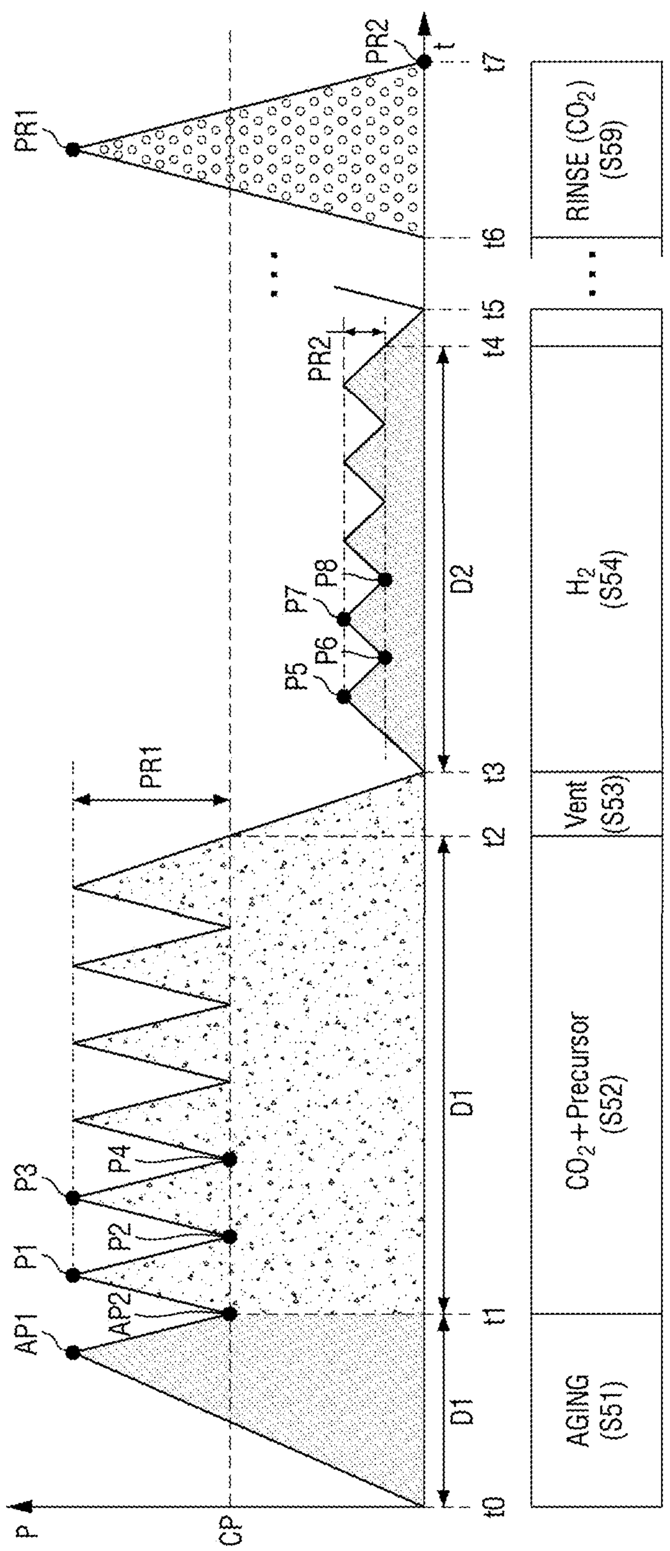
FIG. 10 is a diagram illustrating a change in pressure of a reactor over time to explain a substrate processing method according to some embodiments of the present invention.

FIG. 10 is a diagram illustrating a change in pressure of a reactor over time to explain a substrate processing method according to some embodiments of the present invention. For convenience of explanation, differences from those described using FIG. 4 will be mainly explained.

Referring to FIG. 10, each cycle (e.g., S11) includes an aging step (S51), a first step (or first process fluid supply step) (S52), a first vent step (S53), a second step (or a second process fluid supply step) (S54) and a second vent step (S55). After a plurality of cycles (S11, S12, S13, . . . S19) are performed, a rinse step (S59) is performed.

In the rinse step S59 (i.e., times t6 to t7), a rinse fluid containing carbon dioxide is supplied to the reactor 110. Accordingly, the pressure of the reactor 110 is raised to a pressure RP1 greater than or equal to the critical pressure CP. Next, the rinse fluid is vented from the reactor 110 to lower the pressure of the reactor 110 to the pressure RP2, thereby removing residue inside the reactor 110.

The rinse fluid supply unit that supplies the rinse fluid (i.e., carbon dioxide) in the rinse step (S59) may receive carbon dioxide in a supercritical state from the supercritical fluid supply unit (see 150 in FIG. 2) and supply it to the reactor 110.

The rinse fluid supply unit and the aging fluid supply unit can be configured as one. That is, in the aging step (S51), the valve 177 can be opened to supply carbon dioxide in a supercritical state, and in the rinse step (S59), the valve 177 can be opened to supply carbon dioxide in a supercritical state.

Figure 11:
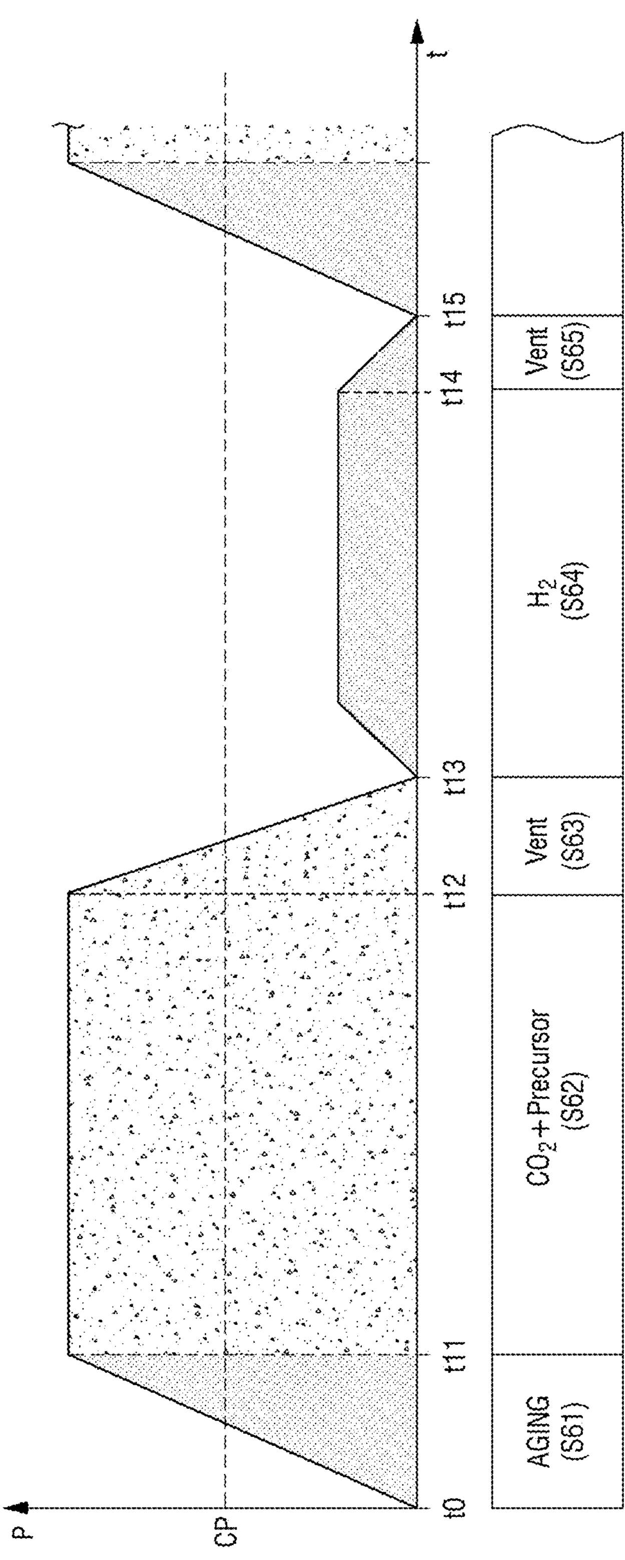
FIG. 11 is a diagram illustrating a change in pressure of a reactor over time to explain a substrate processing method according to some embodiments of the present invention.

FIG. 11 is a diagram illustrating a change in pressure of a reactor over time to explain a substrate processing method according to some embodiments of the present invention. For convenience of explanation, the explanation will focus on differences from those described above.

Referring to FIG. 11, the substrate processing method according to some embodiments of the present invention includes an aging step (S61), a first step (or first process fluid supply step) (S62), a first vent step (S63), a second step (or second process fluid supply step) (S64) and a second vent step (S65).

In the aging step (S61) (i.e., times t0 to t11), an aging operation is performed to create an environment inside the reactor 110.

In the first step S62 (i.e., times t11 to t12), when the pressure of the reactor 110 is raised to a preset pressure by supplying the first process fluid, the pressure is maintained constant. As a method of maintaining the pressure constant, the supply of the first process fluid may be stopped, or the amount of the first process fluid supplied may be vented while maintaining the supply of the first process fluid.

In the first vent step (S63) (i.e., times t12 to t13), the first process fluid inside the reactor 110 is vented.

In the second step (S64) (i.e., times t13 to t14), when the pressure of the reactor 110 is raised to a preset pressure by supplying the second process fluid, the pressure is maintained constant. As a method of maintaining the pressure constant, the supply of the second process fluid may be stopped, or the amount of the second process fluid supplied may be vented while maintaining the supply of the second process fluid.

In the second vent step (S65) (i.e., times t14 to t15), the second process fluid inside the reactor 110 is vented.

Although embodiments of the present invention have been described with reference to the above and the attached drawings, those skilled in the art will understand that the present invention can be implemented in other specific forms without changing the technical idea or essential features. Therefore, the embodiments described above should be understood in all respects as illustrative and not restrictive.

What is claimed is:

1. A method for processing a substrate comprising:

supplying an aging fluid containing carbon dioxide to a reactor to raise a pressure of the reactor to a first aging pressure higher than a critical pressure of carbon dioxide, subsequently, venting the reactor to lower the pressure of the reactor to a second aging pressure higher than the critical pressure of carbon dioxide, subsequently, supplying a first process fluid containing a metal precursor and carbon dioxide to the reactor so that the pressure of the reactor repeats rise and fall within a first pressure range a plurality of times, the first pressure range higher than the critical pressure of carbon dioxide, subsequently, venting the reactor to lower the pressure of the reactor below the first pressure range, subsequently, supplying a second process fluid containing hydrogen to the reactor so that the pressure of the reactor repeats rise and fall within a second pressure range a plurality of times, and subsequently, a venting the reactor to lower the pressure of the reactor below the second pressure range, wherein the second pressure range is less than the critical pressure of carbon dioxide.

2. The method of claim 1, wherein the first pressure range includes a first valley pressure and a first peak pressure such that the pressure of the reactor during the supplying the first process fluid is greater than or equal to the first valley pressure and less than or equal to the first peak pressure, wherein the second pressure range includes a second valley pressure and a second peak pressure such that the pressure of the reactor during the supplying the second process fluid is greater than or equal to the second valley pressure and less than or equal to the second peak pressure, wherein the first peak pressure is 85 to 170 bar, and the first valley pressure is 75 to 160 bar, wherein the second peak pressure is 10 to 20 bar, and the second valley pressure is 5 to 15 bar.

3. A method for processing a substrate comprising:

performing a supercritical process by repeating a first step, a first vent step, a second step, and a second vent step in order a plurality of times, supplying, in the first step, a first process fluid containing a precursor and a first supercritical fluid to a reactor so that a pressure of the reactor repeats rise and fall within a first pressure range a plurality of times, venting, in the first vent step, the reactor to lower the pressure of the reactor below the first pressure range, supplying, in the second step, a second process fluid containing a reducing fluid to the reactor so that the pressure of the reactor repeats rise and fall within a second pressure range different from the first pressure range a plurality of times, and venting, in the second vent step, the reactor to lower the pressure of the reactor below the second pressure range, wherein the second pressure range is less than a critical pressure of the first supercritical fluid.

4. The method of claim 3, wherein a first period during which the first step is performed is greater than a second period during which the second step is performed.

5. The method of claim 3, wherein the precursor is MxLy, in which M is a metal, L is a ligand, and x and y are natural numbers, and the reducing fluid includes $H_2$, wherein the precursor and the reducing fluid react to deposit metal of a preset thickness on the substrate by performing the supercritical process.

6. The method of claim 3 further comprises, a rinse step of removing, after the supercritical process, residue inside the reactor by supplying a rinse fluid containing a third supercritical fluid to the reactor.

7. The method of claim 6, wherein, in the rinse step, the rinse fluid is supplied to the reactor to raise the pressure of the reactor above the critical pressure of the first supercritical fluid, and then the reactor is vented to lower the pressure of the reactor below the critical pressure of the first supercritical fluid.

8. The method of claim 1, wherein the first pressure range includes a first valley pressure and a first peak pressure such that the pressure of the reactor during the first step is greater than or equal to the first valley pressure and less than or equal to the first peak pressure, wherein the second pressure range includes a second valley pressure and a second peak pressure such that the pressure of the reactor during the second step is greater than or equal to the second valley pressure and less than or equal to the second peak pressure, wherein the second peak pressure is less than the first peak pressure.

9. The method of claim 8, wherein the first peak pressure is greater than the critical pressure of the first supercritical fluid.

10. The method of claim 8, wherein the second peak pressure is less than the first valley pressure.

11. The method of claim 3, wherein the supercritical process is performed before the first step and further comprises an aging step for creating an environment inside the reactor, wherein the aging step supplies a second supercritical fluid to the reactor so that the pressure of the reactor becomes higher than the critical pressure of the first supercritical fluid.

12. The method of claim 11, wherein the supercritical process comprises repeating the aging step, the first step, the first vent step, the second step, and the second vent step in order a plurality of times.

13. The method of claim 11, wherein, in the aging step, the second supercritical fluid is supplied to the reactor to raise the pressure of the reactor to a first aging pressure, then the reactor is vented to lower the pressure of the reactor to a second aging pressure.

14. The method of claim 13, wherein the second aging pressure is greater than the critical pressure of the first supercritical fluid.

* * * * *